United States Patent [19]
Kobayashi et al.

[11] Patent Number: 5,700,606
[45] Date of Patent: Dec. 23, 1997

[54] PHOTOMASK AND A MANUFACTURING METHOD THEREOF

[75] Inventors: Shinji Kobayashi, Nara; Masashi Inoue, Sakai, both of Japan

[73] Assignee: Sharp Kabushiki Kaisha, Osaka, Japan

[21] Appl. No.: 630,600

[22] Filed: Apr. 10, 1996

[30] Foreign Application Priority Data

May 31, 1995 [JP] Japan .................. 7-133835

[51] Int. Cl.$^6$ .................. G03F 9/00
[52] U.S. Cl. .................. 430/5; 430/322
[58] Field of Search .................. 430/5, 311, 312, 430/313, 322

[56] References Cited

U.S. PATENT DOCUMENTS

| | | | |
|---|---|---|---|
| 5,487,963 | 1/1996 | Sugawara | 430/5 |
| 5,547,787 | 8/1996 | Ito et al. | 430/5 |

FOREIGN PATENT DOCUMENTS

| | | |
|---|---|---|
| 6-337514 | 12/1994 | Japan . |
| 07128840A | 5/1995 | Japan . |
| 7-140635 | 5/1995 | Japan . |

OTHER PUBLICATIONS

"The Control of Sidelobe Intensity with Arrangement of the Chrome Pattern (COSAC) in Half–Tone Phase–Shifting Mask" S. Kobayashi et a, Extended Abstracts of the 1995 International Conference on Solid State Devices and Materials, Osaka, May 1995, pp. 935–937.

Primary Examiner—S. Rosasco
Attorney, Agent, or Firm—Nixon & Vanderhye, P.C.

[57] ABSTRACT

A half-tone film, a light-shielding film and resist are formed on a transparent substrate in this order, and the resist is removed by adjusting the dosage of exposure for each area so that film-thickness differences are provided. A predetermined pattern is formed on the half-tone film and the light-shielding film by utilizing the film-thickness differences. This half-tone pattern is a pattern to be copied onto resist on a wafer. Moreover, the light-shielding pattern is formed at a place corresponding to a position at which a sidelobe is generated. Thus, it becomes possible to prevent unwanted patterns from being copied, where the half-tone film is maintained to exert high light contrast.

21 Claims, 9 Drawing Sheets

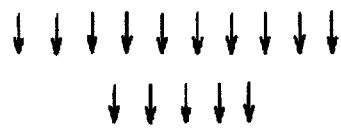
FIG.1(a)
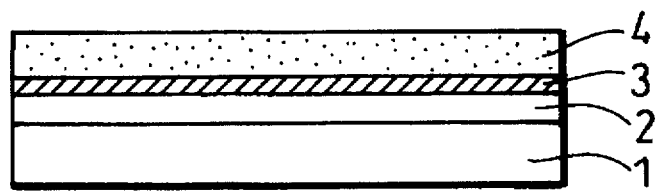
FIG.1(b)
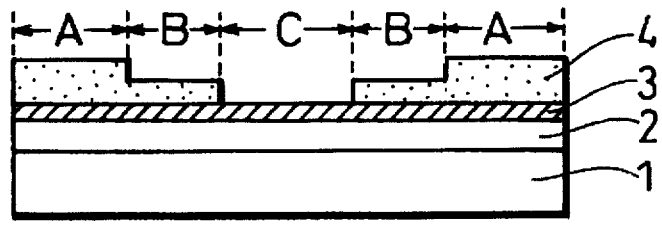
FIG.1(c)
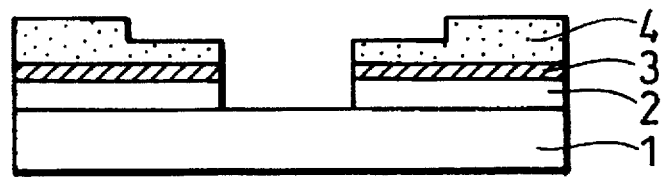
FIG.1(d)
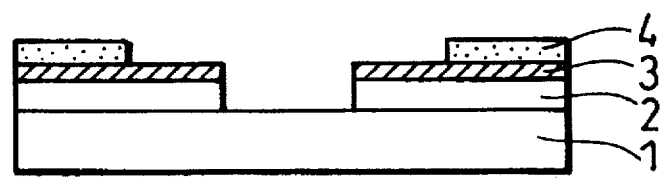
FIG.1(e)
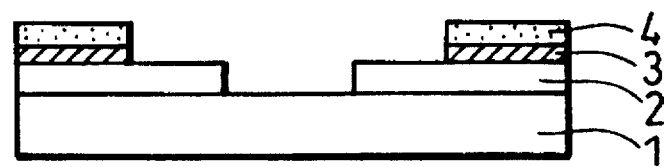
FIG.1(f)
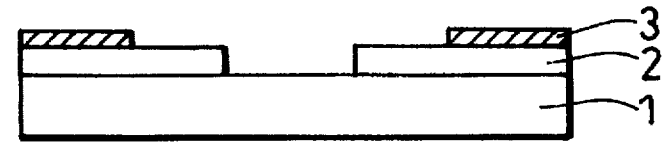
FIG.1(g)
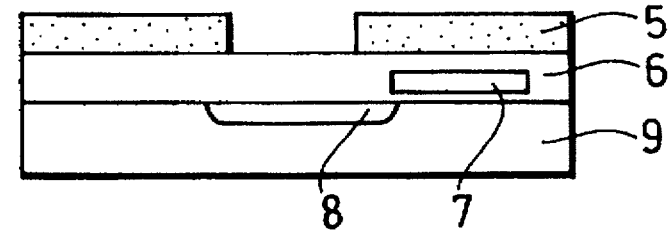

5,700,606

PHOTOMASK AND A MANUFACTURING METHOD THEREOF

FIELD OF THE INVENTION

The present invention relates to a photomask capable of eliminating unwanted patterns that tend to be generated when the photomask has a phase-shifting effect, and also concerns a manufacturing method for such a photomask.

BACKGROUND OF THE INVENTION

Conventionally, reduced projection exposure has been utilized as an exposing method for manufacturing semiconductors and integrated circuits. In reduced projection exposure, an enlarging mask (reticle) is used and patterns are reduced by a reduction lens, and copied onto the resist on a wafer. In the case when mask patterns are copied by using the reduced projection exposure, there has been proposed a method wherein the resolution of the resist pattern on a wafer and the depth of focus are improved by introducing phases into the light transmitted through the mask. In other words, it has been proposed that a transparent film (hereinafter, referred to as the "shifter"), which inverts the phase of the transmitted light by 180°, be placed at at least one of the light-transmitting sections (aperture sections) located on both sides of an opaque section (light-shielding section) on the photomask.

However, the problems of this arrangement are that the placement of the shifter is difficult in the case of a complicated element pattern, and that the number of manufacturing processes of the mask is increased to twice as many as the number of those processes in conventional arrangements. In order to eliminate the use of the shifter, Japanese Laid-Open Patent Application No. 136854/1992 (Tokukaihei 4-136854) discloses a photomask (hereinafter, referred to as "half-tone mask") wherein a semitransparent film (hereinafter, referred to as "half-tone film") is used on a light-shielding section for forming a pattern. In this arrangement, the phase-shifting effect is obtained by inverting the phase of leak light that slightly passes through the half-tone film (generally, 6 to 10%) by 180° with respect to the light that passes through the aperture section.

At first, the half-tone mask had a two-layer film structure of chrome and $SiO_2$ (SOG and other materials). In this case, the transmittance was controlled by reducing the chrome film thickness, and the phase difference was controlled by adjusting the film thickness and the refractive index of $SiO_2$. Here, the film thickness of $SiO_2$ is indicated by:

$$d=\lambda/(2n-2),$$

wherein n represents the refractive index and λ represents the wavelength of exposure light.

However, since $SiO_2$, which is a non-metallic material, exhibits no thermal absorption to laser beams, the laser zapping, which has been used for repairing defects of conventional chrome patterns, can not be used for correcting defects of $SiO_2$ patterns. This results in an inherent problem of the phase-shifting method. As a result of research to find alternate materials for the shifter so as to solve the above-mentioned problem, Japanese Patent Laid-Open Publication No. 140635/1995 (Tokukaihei 7-140635) has proposed a method wherein an oxide-nitride film of MoSi or other materials is adopted. With this arrangement, the conventional laser zapping can be applied to the defect-correction process. Moreover, since the oxide-nitride film of MoSi or other materials is controlled in its content rates of oxygen and nitrogen by changing reactive sputtering conditions, it becomes possible to simultaneously satisfy the transmittance and the phase difference even with the use of monolayer film. As shown in FIG. 4(a), the half-tone mask has an arrangement wherein a single half-tone film 2 is provided on a transparent substrate 1'.

However, in the case when a pattern is copied onto, for example, resist on a wafer by using such a half-tone mask, since the light-transmitting section of the half-tone mask is a half-tone film having a slight transmittance, a sidelobe is generated at a position where the 1st-order diffracted light and leak light from the half-tone film 2' interfere with one another at the same phase on the wafer. As shown in FIG. 9, the sidelobe intensity is dependent upon the transmittance (indicated by T in FIG. 9) of the halftone film 2', and they have a correlationship so that as the transmittance increases, the sidelobe intensity also increases. Here, FIG. 9 shows an example wherein the transmittance T is increased from 0%, to 4%, to 8%, to 16%, and to 36%, by using light whose wavelength is 365 nm under the conditions of the numerical aperture of a lens NA=0.42 and the coherence δ=0.3.

When the sidelobe intensity reaches the resist sensitivity, an unwanted pattern is printed. For example, in the case when a contact hole pattern 11 is isolated on a mask as shown in FIG. 6(a), a ring pattern in the shape of a concentric circle is formed around a contact hole pattern 13 on the wafer as an unwanted pattern 14 (see FIG. 6(b) and FIG. 4(b)). Here, reference number 12 indicates the position of the generated sidelobe. Further, FIG. 6(c) shows the light-intensity distribution in an a—a' cross-section on the wafer, when the mask pattern of FIG. 6(a) is used.

From the point of view of light contrast, the higher the setting of the transmittance of the half-tone film, the more desirable. In this case, it is an absolute condition that the thickness of the resist film of the light-shielding section be maintained where the resist sensitivity is taken into consideration. However, at present, the transmittance has to be set so as not to generate unwanted patterns, since this arrangement is mostly limited by the prevention against copying of unwanted patterns.

Moreover, a plurality of sidelobes tend to overlap with one another depending on pattern layouts, thereby making the sidelobe intensity greater, compared with that of the isolated pattern. Therefore, in order to prevent copying of unwanted patterns due to the plural sidelobes, it is necessary to further reduce the transmittance of the half-tone film, compared with that of the isolated pattern.

For example, in the case where a plurality contact-hole patterns 11 are aligned laterally in a row (see FIG. 7(a)), or where a plurality of contact-hole patterns 11 are arranged laterally and longitudinally (see FIG. 8(a)), unwanted patterns 14, shown in FIG. 7(b) and FIG. 8(b) respectively, are copied. Here, FIG. 7(c) and FIG. 8(c) show the light-intensity distributions respectively in cases when contact holes are arranged in 5 rows with one column and when they are arranged in 5 rows with 5 columns. Here, in the drawings, reference number 15 indicates the light intensity of the contact-hole patterns and reference number 16 indicates the light intensity of the sidelobes.

Moreover, in order to provide means for preventing unwanted patterns, except for the control of the transmittance as described above, there has been proposed another method wherein the mask bias is controlled. For example, in the case of contact hole patterns, as the mask bias increases, the exposed dosage becomes smaller upon copying operation, resulting in reduction in the sidelobe intensity. This arrangement makes it possible to positively prevent the copying of unwanted patterns; however, it also results in a problem of reduction in the light contrast.

As described above, the prevention against Copying of unwanted patterns, which is provided by the control of transmittance or the control of mask bias, is only achieved at the expense of the inherent performance of half-tone masks in which high light contrast can be obtained, and a satisfactory solution for the problem has not yet been obtained.

SUMMARY OF THE INVENTION

The objective of the present invention is to provide a photomask for preventing copying of unwanted patterns where maintaining high light contrast that is an inherent feature of a half-tone mask, and also to provide a manufacturing method thereof.

In order to achieve the above-mentioned objective, the photomask of the present invention is characterized by having a transparent substrate through which exposure light transmits, a semitransparent film that has an inversion transmitting section for inverting the phase of the exposure light and a transmitting section that allows the exposure light to pass without changing the phase, and that forms a pattern on the transparent substrate by using the inversion transmitting section and the transmitting section, and a light-shielding film that is formed at least one portion on the semitransparent film that corresponds to a position at which the 1st-order diffracted light of the transmitted light that has passed through the transmitting section is directed to an exposure-receiving surface.

In this arrangement, the light that has passed through the inversion transmitting section has an inverted phase to the light that has passed through the transmitting section; therefore, the light intensity at their border section becomes close to zero. Thus, the ratio between the light intensity of the light that has passed through the inversion transmitting section and the light intensity of the border section becomes relatively greater, thereby providing a light-intensity distribution with high contrast. Consequently, it becomes possible to form a fine pattern on the exposure-receiving surface with high contrast.

In this case, since the light-shielding film is placed at a predetermined position on the semitransparent film, it is possible to reduce the intensity of a sidelobe that is generated by the interference between the 1st-order diffracted light of the transmitted light that has passed through the transmitting section and the light that has passed through the inversion transmitting section. As a result, it becomes possible to prevent unwanted patterns from being copied on the exposure-receiving surface. Moreover, degradation of the light contrast can be suppressed to a minimum by optimizing the placement and size of a pattern of the light-shielding film so as to adjust the sidelobe intensity.

Furthermore, a manufacturing method of the photomask has a process for successively forming a semitransparent film, a light-shielding film and a resist film on a transparent substrate, a process for patterning the resist film so as to provide a pattern of the semitransparent film in a first area after forming the resist film so as to become thinner at the first area that at a second area, as well as for removing the light-shielding film and the semitransparent film by using the pattern of the resist film as a mask, and a process for removing only the resist film in the first area completely by utilizing the difference of thicknesses of the resist films in the first area and the second area, as well as for removing the light-shielding film by using the resist film in the second area as a mask.

With this method, the light-shielding film is placed at a predetermined position on a reticle with high accuracy. Consequently, it is possible to easily provide the photomask of the present invention.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) is a cross-sectional view showing the first manufacturing process of a photomask in accordance with one embodiment of the present invention.

FIG. 1(b) is a cross-sectional view showing the second manufacturing process of the photomask of FIG. 1(a).

FIG. 1(c) is a cross-sectional view showing the third manufacturing process of the photomask of FIG. 1(a).

FIG. 1(d) is a cross-sectional view showing the fourth manufacturing process of the photomask of FIG. 1(a).

FIG. 1(e) is a cross-sectional view showing the fifth manufacturing process of the photomask of FIG. 1(a).

FIG. 1(f) is a cross-sectional view showing the sixth manufacturing process of the photomask of FIG. 1(a).

FIG. 1(g) is a cross-sectional view showing a contact-hole pattern that has been made by using the photomask.

DESCRIPTION OF THE EMBODIMENTS

FIGS. 1 through 3, FIG. 5(a)–5(b) and FIG. 8(a)–8(b) pertain to one embodiment of the present invention.

Figure 5A:
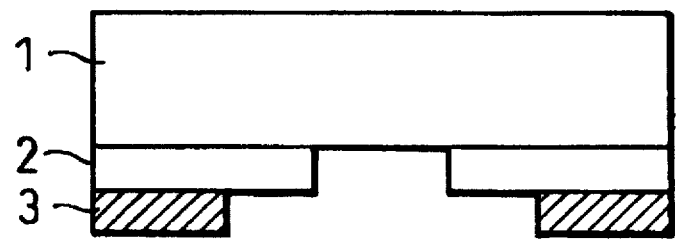
FIG. 5(a) is a cross-sectional view of a photomask in accordance with one embodiment of the present invention.
Figure 5B:
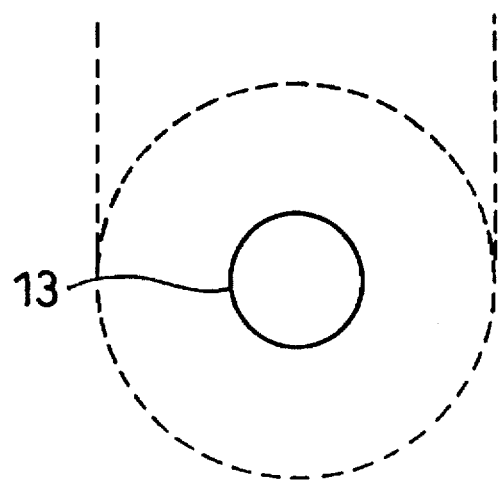
FIG. 5(b) is an explanatory drawing that shows a copied pattern that has been obtained by using the mask of FIG. 5(a).

As shown in FIG. 5(a), a photomask of the present embodiment has an arrangement wherein a half-tone film (semitransparent film) 2 and a light-shielding film 3 are stacked on a transparent substrate 1 that transmits exposure light in this order.

The half-tone film 2 is constituted of an inversion transmitting section for inverting the phase of the exposure light and a transmitting section (aperture section) at which the transparent substrate 1 is bared. Here, the inversion transmitting section and transmitting section form a pattern on the transparent substrate 1, which is copied onto resist on a wafer (exposure-receiving surface).

The light-shielding film 3 is provided so as to prevent unwanted patterns from being generated around the pattern formed on the wafer. In other words, the light-shielding film 3 is provided on a portion on the half-tone film 2 that corresponds to a position at which the 1st-order diffracted light of transmitted light that has passed through the transmitting section is directed onto the wafer. Here, the pattern of the light-shielding film 3 is referred to as a light-shielding pattern. If the light-shielding film 3 is not provided, a sidelobe is generated at a position indicated by a dashed line in FIG. 5(b) because light that has passed through the inversion transmitting section is also directed to the position at which the 1st-order diffracted light is directed.

The following description will discuss the position at which the light-shielding film 3 is formed.

The generation of unwanted patterns is dependent on the sidelobe intensity, as was described earlier. In other words, the sidelobe intensity after interferences becomes greater when sidelobes have a positional relationship (pattern pitch) in which their lights interfere with one another at the same phase, and it also becomes greater as the number of overlaps increases, thereby resulting in more unwanted patterns.

The position of sidelobe generation can be calculated from the pattern size, pattern pitch and exposure conditions. Here, the exposure conditions include the wavelength of exposure light, the coherence factor δ, the numerical aperture NA of a lens, the aperture size of the mask and other conditions. Further, the magnitude of light intensity of a sidelobe on a wafer can be found by taking into consideration the transmittance of the half-tone film 2. It is possible to determine where to place the light-shielding pattern based upon the light intensity and resist sensitivity.

Figure 8A:
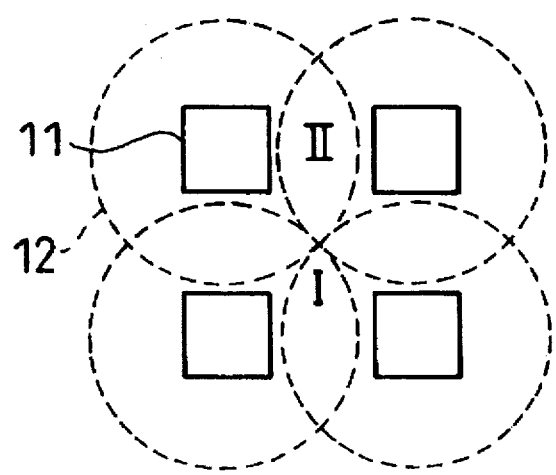
FIG. 8(a) is an explanatory drawing that shows the relationship between a mask pattern and sidelobe position in the case when four contact holes are placed in a conventional arrangement.
Figure 8B:
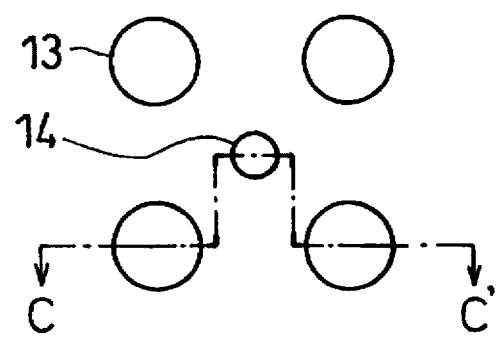
FIG. 8(b) is an explanatory drawing that shows a copied pattern that has been obtained by using the mask pattern of FIG. 8(a).
Figure 8C:
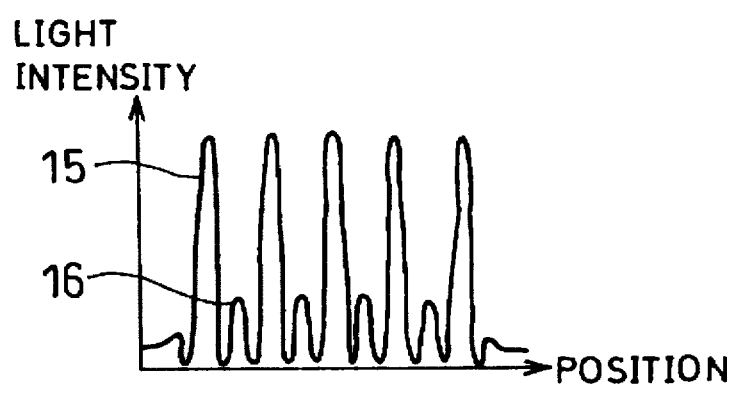
FIG. 8(c) is a distribution diagram of light intensity on a wafer when the mask pattern of FIG. 8(a) is used.
Figure 9:
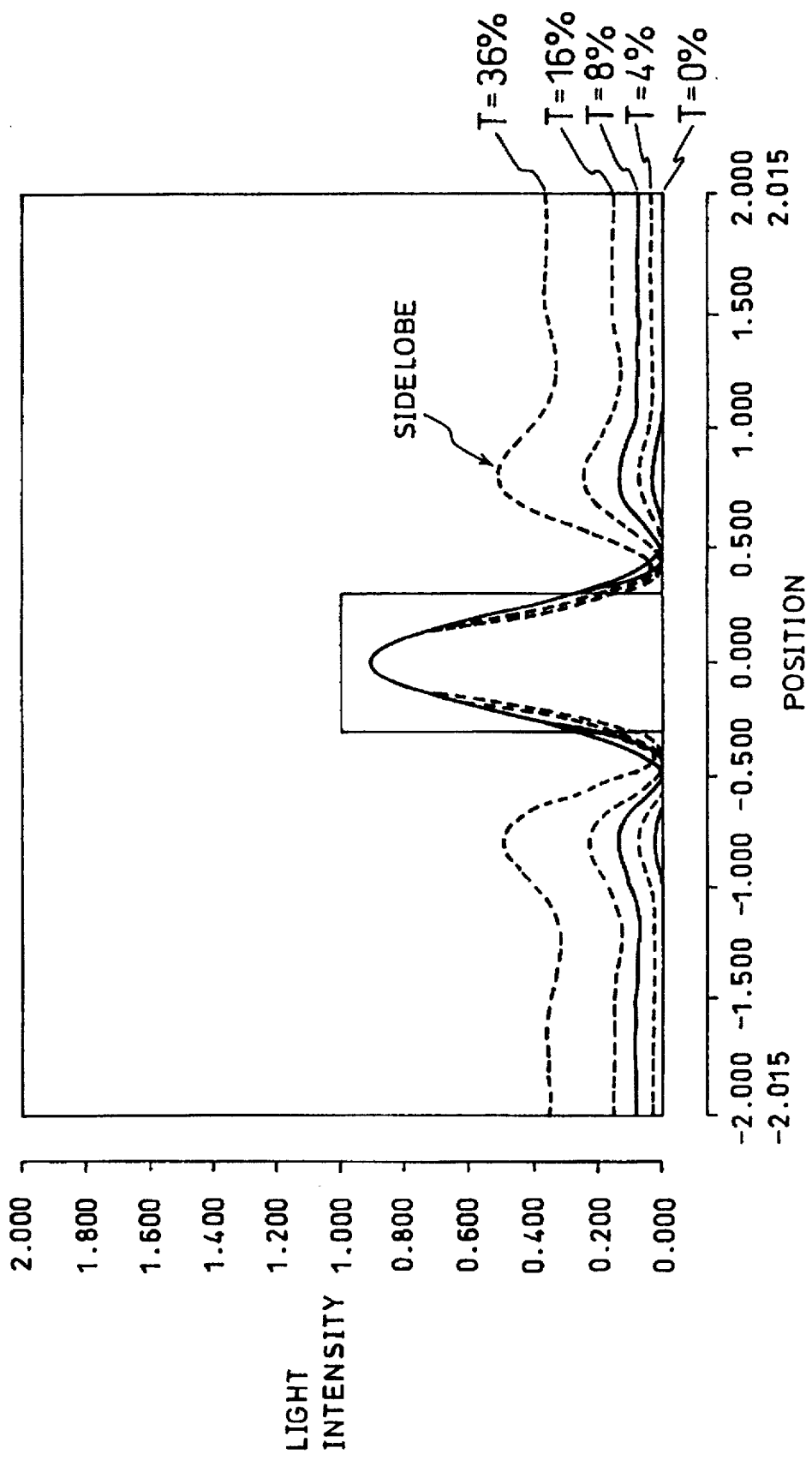
FIG. 9 is a graph that shows the relationship between the light transmittance and the light-intensity distribution.

For example, suppose a photomask that has a plurality of contact-hole patterns 11 formed laterally as well as longitudinally (see FIG. 8(a)). In this state shown in the drawing, the position of generation of an unwanted pattern is given as point I at which four sidelobe positions 12 overlap with one another. Here, in the case when the transmittance of the half-tone film is set to a value so as not to generate unwanted patterns due to a sidelobe with respect to an isolated contact hole, as the pattern pitch of the contact-hole patterns 11 increases, the position of generation of an unwanted pattern shifts from point I to point II. Then, the unwanted pattern disappears at the point when the distance becomes so long that the sidelobes no longer interfere with one another.

In the case when the unwanted pattern is generated at point I, it is clear that all the sidelobes of the surrounding four contact-hole patterns 11 overlap with one anther, and the sidelobe intensity marks a maximum value at point I. The maximum value of sidelobe intensity at point I exceeds the maximum value of sidelobe intensity at point II, which is caused by the difference between the numbers of overlaps. However, in the case when the maximum value is marked at point II, since the distance between the sidelobes is great at point I, the intensity goes below the maximum value at point II. Thus, the copy position of the unwanted pattern shifts depending on the pattern pitch.

Figure 5C:
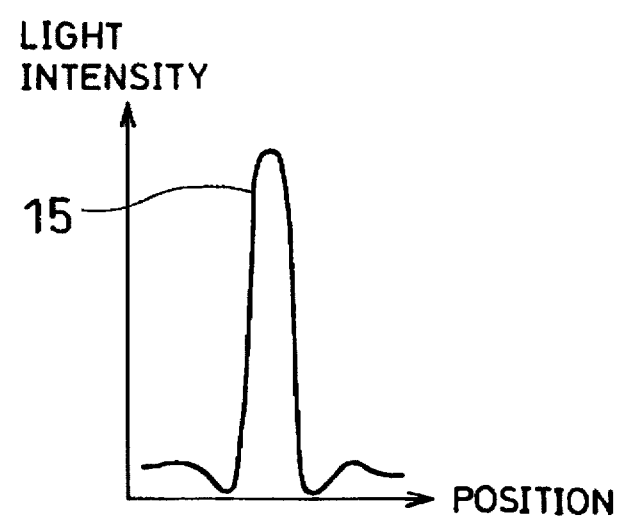
FIG. 5(c) is a distribution diagram of light intensity on a wafer when the mask of FIG. 5(a) is used.
Figure 6A:
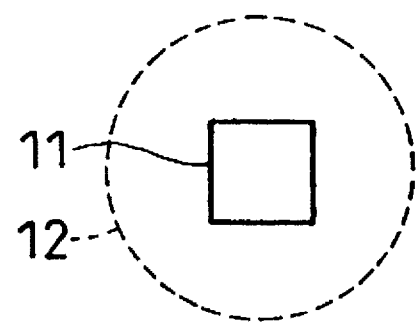
FIG. 6(a) is an explanatory drawing that shows the relationship between a mask pattern and sidelobe position in the case when one contact hole is placed in a conventional arrangement.
Figure 6B:
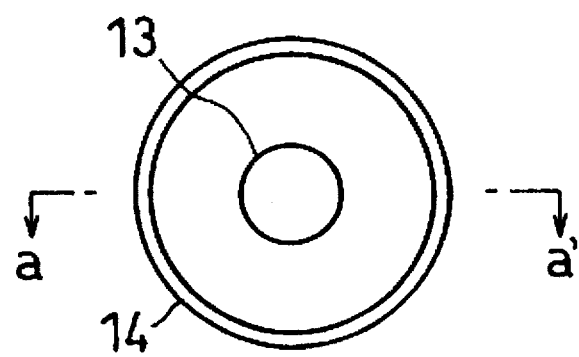
FIG. 6(b) is an explanatory drawing that shows a copied pattern that has been obtained by using the mask pattern of FIG. 6(a).
Figure 6C:
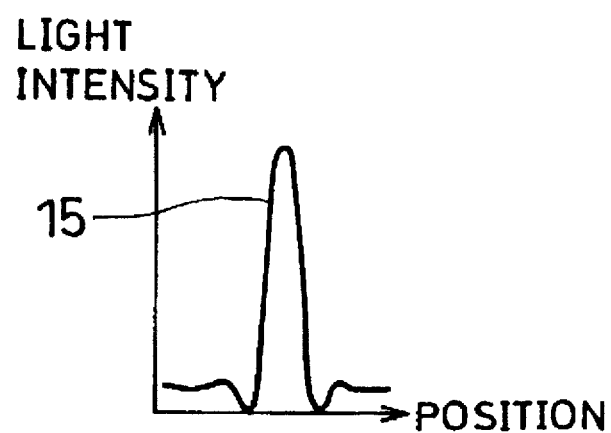
FIG. 6(c) is a distribution diagram of light intensity on a wafer when the mask pattern of FIG. 6(a) is used.
Figure 7A:
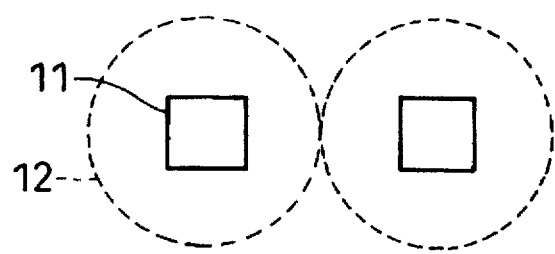
FIG. 7(a) is an explanatory drawing that shows the relationship between a mask pattern and sidelobe position in the case when two contact holes are placed in a conventional arrangement.
Figure 7B:
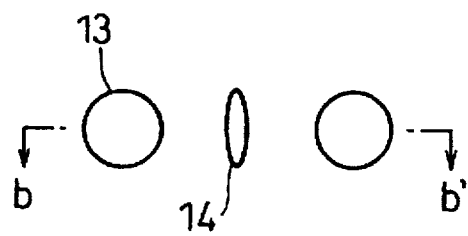
FIG. 7(b) is an explanatory drawing that shows a copied pattern that has been obtained by using the mask pattern of FIG. 7(a).
Figure 7C:
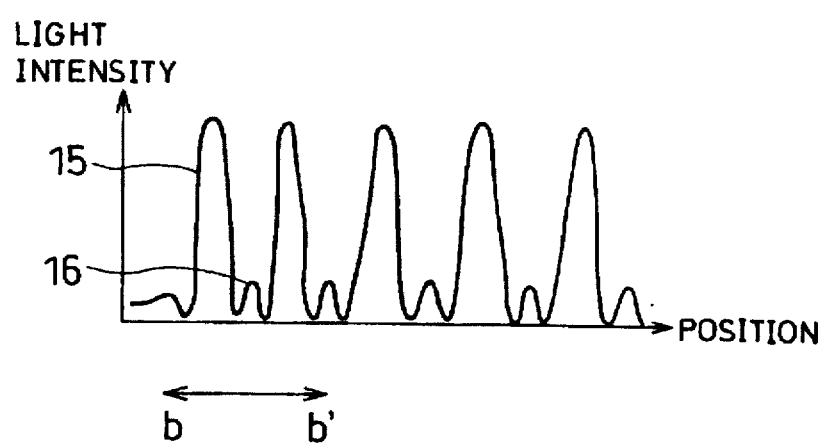
FIG. 7(c) is a distribution diagram of light intensity on a wafer when the mask pattern of FIG. 7(a) is used.

Since the sidelobe position at which an unwanted pattern is generated is limited by a mask-pattern layout as described above, the photomask of the present embodiment has a light-shielding treatment that is provided at the position of unwanted-pattern generation by using, for example, chrome. With this arrangement, since the transmittance of only a specific portion on a reticle that corresponds to this sidelobe position is set to virtually zero as shown in FIG. 5, it is possible to eliminate a portion of light that has transmitted through the half-tone film 2 and that contributes to the sidelobe intensity. Consequently, the sidelobe intensity is reduced, thereby making it possible to prevent the generation of unwanted patterns.

Additionally, the light-shielding treatment that is provided at the sidelobe position by using a material such as chrome tends to cause a reduction in light contrast; however, this treatment is provided to the extent that the sidelobe intensity becomes lower that the resist sensitivity. In other words, it is possible to prevent the generation of an unwanted pattern where maintaining the inherent performances of the half-tone mask, by optimizing conditions, such as the size and arrangement of a light-shielding pattern (chrome pattern).

Figure 2A:
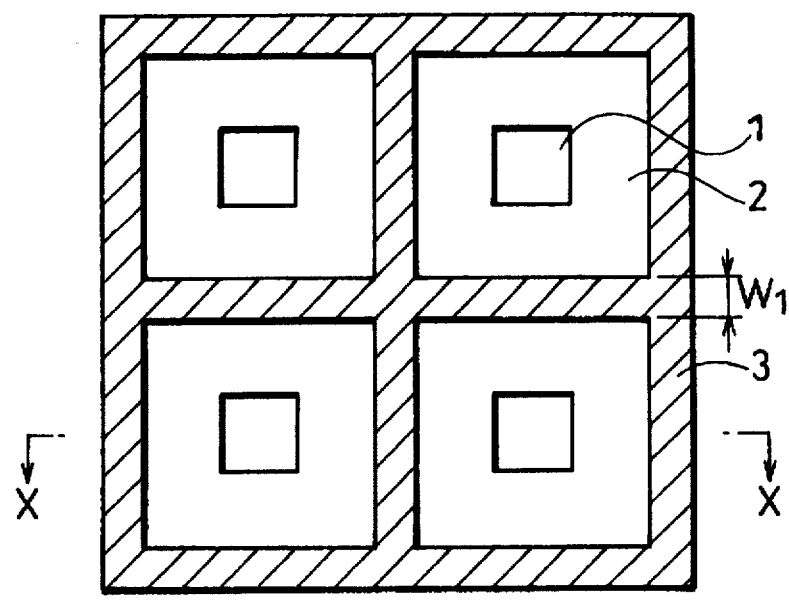
FIG. 2(a) is a front view showing a layout pattern of a photomask that shields light from point I and point II in FIG. 8.
Figure 2B:
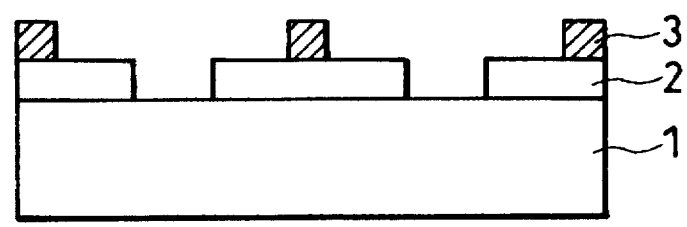
FIG. 2(b) is a X—X cross-Sectional view in FIG. 2(a).
Figure 2C:
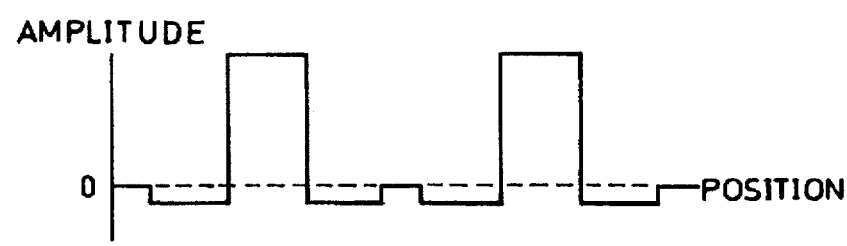
FIG. 2(c) is a distribution diagram that shows the amplitude distribution of light that has passed through the photomask of FIG. 2(a).

FIG. 2 shows an example of a photomask whereon a plurality of contact-hole patterns are respectively arranged laterally as well as longitudinally. In this photomask, aperture sections at which the transparent substrate 1 is bared form the contact-hole patterns. The light-shielding film 3 is formed so that each opening thereof surrounds each aperture section with a constant distance from the aperture section. The positions at which the light-shielding film 3 is formed coincide with the sidelobe positions 12 shown in FIG. 8(a). In this case, the line width $W_1$ of the chrome pattern serves as a controlling parameter, and the phase-shifting effect decreases as the line width $W_1$ increases where it increases as the line width $W_1$ decreases. Here, the sidelobe intensity need not be set to a minimum value, and as long as the value is maintained below the resist sensitivity, it is preferably set so that the phase-shifting effect is exerted to a great degree.

Figure 3A:
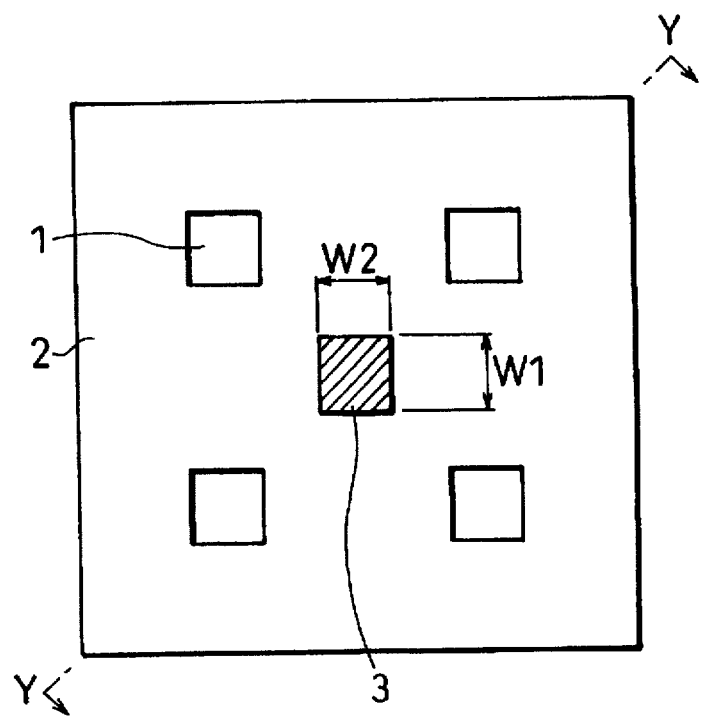
FIG. 3(a) is a front view showing a layout pattern of a photomask that shields light from point I in FIG. 8.
Figure 3B:
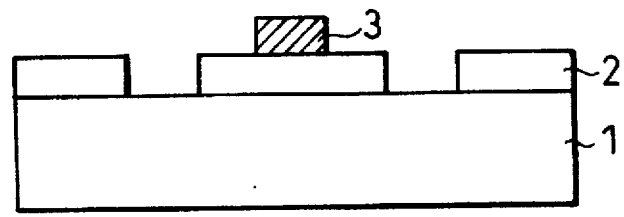
FIG. 3(b) is a Y—Y cross-sectional view in FIG. 3(a).
Figure 3C:
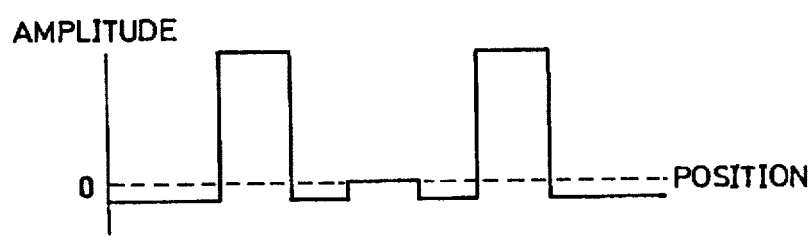
FIG. 3(c) is a distribution diagram that shows the amplitude distribution of light that has passed through the photomask of FIG. 3(a).
Figure 4A:
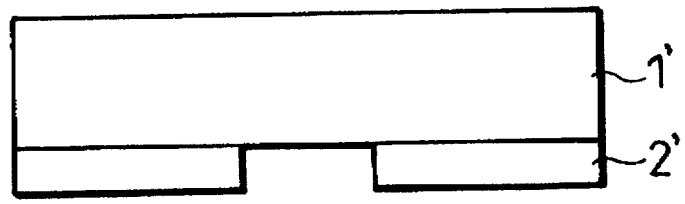
FIG. 4(a) is a cross-sectional view of a conventional half-tone mask.
Figure 4B:
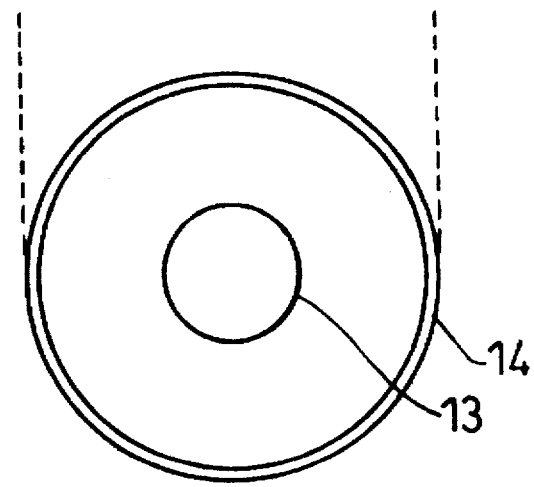
FIG. 4 (b) is an explanatory drawing that shows a copied pattern that has been obtained by using the mask of FIG. 4(a).
FIG. 4(c) is a distribution diagram of light intensity on a wafer when the mask of FIG. 4(a) is used.
Figure 4C:
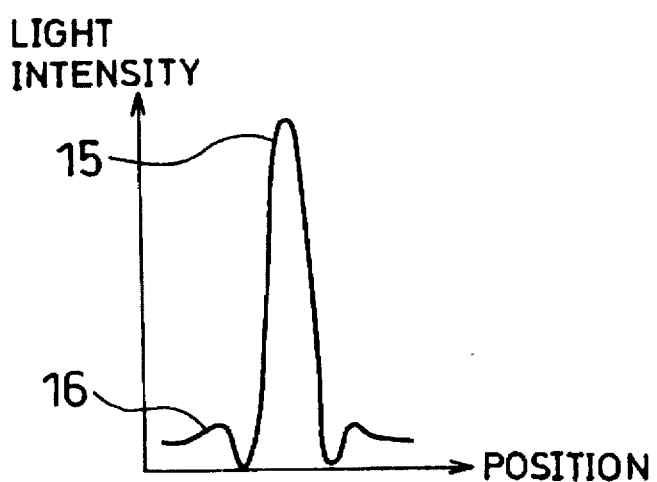

FIG. 3 shows an example wherein the light-shielding treatment is provided only at a position at which the sidelobe intensity marks the greatest value. In other words, the light-shielding pattern is placed not at the position corresponding to point II of FIG. 8(a) (in the vicinity of the center of two contact-hole patterns), but only at the position corresponding to point I thereof (in the vicinity of the center of four contact-hole patterns). In this case, since the maximum value of the sidelobe intensity at point II is not more that one-half of that at point I, the intensity reduction at point II is achieved at the same time by optimizing the light-shielding pattern size $W_2$ at point I, although the rate of reduction in the sidelobe intensity goes lower than that at point I. In other words, if the size $W_2$ of the chrome pattern is too large, diffracted light generated by the edge of the chrome pattern approaches point II, thereby causing a film thickness loss at point II.

Additionally, it is possible to adopt an arrangement wherein the light-shielding treatment is provided by the use of a chrome pattern with respect to point I, where the treatment is provided by controlling the mask bias only with respect to point II. In other words, the sidelobe intensity is reduced at point II by increasing the mask bias so as to make the optimal exposure dosage smaller upon copying operation. Although the mask bias method tends to cause degradation in light contrast, it is possible to minimize the degradation in light contrast when only point II, which has the maximum value of approximately one-half of that of point I, is subjected to the reduction of sidelobe intensity.

Next, referring to FIGS. 1(a) through 1(g), the following description will discuss manufacturing processes of the photomask.

As shown in FIG. 1(a), a half-tone film 2 is formed on a transparent substrate 1. On this film, a light-shielding film 3 is formed by using a material such as chrome that has light-shielding and conductive (several tens $\Omega$) properties through the spattering method or other methods. Successively, resist 4 is applied thereto with a thickness of approximately 5000 Å.

Here, in addition to oxide-nitride films such as Molybdenum silicide oxide-nitride (MoSiON) and Chromium oxide-nitride (CrON) films, any film can be used as the half-tone film 2 as long as it has a predetermined transmittance. Further, the film thickness of the half-tone film 2 is preferably set so as to provide a predetermined phase-shifting effect. For example, for MoSiON, a film thickness of 165 nm is required by the use of i-line stepper. Moreover, the required transmittance is 6 to 8%, for example, in the case of i-line.

With respect to the light-shielding film 3, thin films whose optical density is approximately 3.0 (not less that 2.9) can be used. In the case of chrome, since its optical density is approximately 3.0 at 1.00 nm, the thickness of chrome needs to be set to approximately 100 nm. However, when a CrON film is used as the half-tone film 2, a Cr film can not be used as the light-shielding film 3 because a sufficient selection ratio cannot be obtained during the etching process. Accordingly, it is necessary to appropriately select the combination of the half-tone film 2 and the light-shielding film 3. In the case when chrome can not be used as the light-shielding film 3, MoSi and Mo can be adopted. In this case, the thickness may be set to be as thick as that of chrome; however, since their optical density is slightly lower than that of chrome, it is preferable to make the thickness slightly thicker correspondingly. Additionally, MoSi, which has a high light-shielding property, is formed into a semi-transparent film by adding 0 and N so as to increase its light-transmitting property before it is used.

Moreover, the exposure area (a portion of a stepper without a blind) of the photomask is constituted of a complete-light-shield area A (second area), a pattern-forming area B (first area) and a light-transmitting area C, which are shown in FIG. 1(b). As shown in FIG. 1(f), the complete-light-shield area A is an area wherein the light-shielding film 3 (/the half-tone film 2/the transparent substrate 1) is left after the patterning process; the pattern-forming area B is an area wherein a desired pattern is formed only by the half-tone film 2; and the light-transmitting area C is an area from which the light-shielding film 3 and the half-tone film 2 are removed.

In the exposure process, the dosage of exposure is adjusted so that the complete-light-shield area A remains as an unexposed portion, and so that the pattern-forming area B has remaining resist 4 whose film-thickness is approximately one-half of that on the complete-light-shield area A after the development through exposure (see FIG. 1(a)). The dosage of exposure onto the pattern-forming area B is normally set to approximately one-third of the dosage of exposure required for completely removing the resist 4. In general, since EB (Electron Beam) resist has a smaller $\tau$-value (the rate of change in a remaining resist film in relation to the dosage of exposure) compared with photoresist, this controlling technology is sufficiently available. Further, upon exposure onto the pattern-forming area B, the light-transmitting area C is continuously exposed under the same conditions, and an additional dosage of exposure is further applied so as to make up for insufficiency for the resist patterning process. For example, the first exposure is applied with a dosage of exposure of 1.0 $\mu C/cm^2$, and the additional exposure is applied with a dosage of exposure of 1.8 $\mu C/cm^2$.

After the exposing and developing processes as described above, the resist 4 has a cross-sectional shape shown in FIG. 1(b). Here, the thickest portion of the resist 4 is approximately 4200 Å thick, and the thinnest portion thereof is approximately 2100 Å thick.

Next, the light-shielding film 3 is subjected to an etching process. In the etching process, either a wet-etching method, which is commonly used for Cr etching, or a dry-etching method may be applied.

Successively, the half-tone film 2 is subjected to a dry-etching process (see FIG. 1(c)). In this case, the resist 4, together with the light-shielding film 3 that is a layer under the resist 4, serves as a mask. Therefore, when $CF_4$ and $O_2$ are used as dry-etching gases, the selection ratio on the half-tone film 2 and masking materials is improved to a great degree, compared with the case where only the resist 4 is used as the mask. Thereafter, an $O_2$ plasma-ashing process is applied to the entire surface so that resist is completely removed only from the area (the pattern-forming area B) covered with the thin resist 4. Consequently, the film thickness of the complete-light-shield area A is set to one-half of the thickness at the first stage (see FIG. 1(d)). Then, the light-shielding film 3 is again subjected to an etching process (see FIG. 1(e)). Here, a high selectivity is required in the etching process on the light-shielding film 3, since a sufficient phase-shifting effect is not available upon removing the light-shielding film 3, if a film thickness loss occurs in the half-tone film 2 that forms the bed. In the case when chrome is used as the light-shielding film 3, sufficient selectivity is obtained with respect to the bed (the half-tone film 2) and no degradation occurs in the bed, when the chrome is removed by a wet-etching process that uses Cerium (II) diammonium nitrate as an etchant; however, this arrangement fails to form fine chrome patterns. For this purpose, a dry-etching process is carried out. Finally, a photomask is formed by completely removing the resist 4 (see FIG. 1(f)).

The above-mentioned processes, shown in FIGS. 1(a) through 1(f), makes it possible to provide a light-shielding pattern that is effective on reduction in the sidelobe intensity at a desired position on a reticle with high positional accuracy, and consequently to produce a photomask shown in FIG. 1(g) and FIG. 5(a) in a stable manner. As described earlier, this photomask having the optimized light-shielding pattern prevents unwanted patterns from being copied, and ensures inherent functions of half-tone patterns that are required to enhance the depth of focus (DOF) of resist patterns on a wafer. Further, it becomes possible to meet the demands of device patterns having complicated pattern layouts by eliminating unwanted patterns that are generated depending on layout patterns. As a result, the lithography process using the photomask is improved in its mass-productivity.

For example, a resist pattern for forming contact holes, shown in a cross-sectional view in FIG. 1(g), can be obtained by utilizing the photomask that has been produced by the above-mentioned processes. In other words, a source/drain region 8 is formed on a semiconductor substrate 9, and an interlayer insulating film 6 having a gate electrode 7 is provided thereon. Then, resist 5 is patterned by using the photomask of the present invention.

Additionally, in the manufacturing processes of the present invention, it may be proposed that the light-shielding pattern and the half-tone pattern are provided by using individual resist patterns. However, this case needs to have two resist-pattern-forming processes, thereby causing not only an increase in the processes but also difficulty in positioning upon forming the two resist patterns. In other words, alignment marks have to be provided upon forming the first resist pattern, and after having carried out a positioning process based on these alignment marks, the second resist pattern has to be formed.

The positioning accuracy (±0.005 µm) of EB exposure of the present embodiment in the case of continuous double exposures is higher that the positioning accuracy by the use of the alignment marks. Therefore, it becomes possible to manufacture simple photomasks with high controllability by using the features of the EB exposure.

Similarly, in the case of a plurality of chip patterns that are placed on one photomask, the light-shielding films 3 are preferably provided in the periphery of each chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photomask for forming a pattern on an exposure-receiving surface of a wafer, the photomask comprising:
  a transparent substrate through which exposure light is transmissible;
  a semitransparent film that has a transmitting section that allows the exposure light to pass without changing the phase of the exposure light and an inversion transmitting section that is adjacent to the transmitting section and that inverts the phase of the exposure light, the semitransparent film being arranged to form a pattern on the transparent substrate by using the inversion transmitting section and the transmitting section; and
  a light-shielding film that is formed on a portion of the semitransparent film that corresponds to a portion of the exposure-receiving surface to which a 1st order diffracted light ray of the transmitted light that has passed through the transmitting section is directed.

2. The photomask as defined in claim 1, wherein the light-shielding film is arranged so that the magnitude of light intensity of a sidelobe that is generated on the exposure-receiving surface due to the interference between the 1st-order diffracted light and the light that has passed through the inversion transmitting section is not more than the resist sensitivity of the exposure-receiving surface.

3. The photomask as defined in claim 1, wherein, in the case of a plurality of transmitting sections, the light-shielding film is placed based on a position at which a plurality of sidelobes, which are supposed to be generated on the exposure-receiving surface without the light-shielding film due to the interference between the 1st-order diffracted light and the light that has passed through the inversion transmitting section, overlap and interfere with one another.

4. The photomask as defined in claim 1, wherein the light-shielding film is placed based on only a position at which a sidelobe, which is supposed to be generated on the exposure-receiving surface without the light-shielding film due to the interference between the 1st-order diffracted light and the light that has passed through the inversion transmitting section, has the greatest intensity.

5. The photomask as defined in claim 1, wherein the light-shielding film is formed so as to have an optical density of approximately 3.0.

6. The photomask as defined in claim 1, wherein the light-shielding film is made of a material selected from a group consisting of Cr, MoSi and Mo.

7. The photomask as defined in claim 1, wherein the light-shielding film is made of a material that is either of MoSi and Mo and the semitransparent film is made of CrON.

8. The photomask as defined in claim 1, wherein the light-shielding film is made of Cr and the semi-transparent film is made of MoSiON.

9. The photomask as defined in claim 1, wherein the portion of the semitransparent film on which the light-shielding film is formed corresponds to a portion of the exposure-receiving surface which receives 1st order diffracted light rays of the transmitted light from differing portions of the transmitting section.

10. A manufacturing method, which is used for a photomask for forming a pattern on an exposure-receiving surface of a wafer comprising:
  a transparent substrate through which exposure light is transmissible;
  a semitransparent film that has
  a transmitting section that allows the exposure light to pass without changing the phase of the exposure light, and
  an inversion transmitting section that is adjacent to the transmitting section for inverting the phase of the exposure light,
  the semitransparent film being arranged to form a pattern on the transparent substrate by using the inversion transmitting section and the transmitting section; and
  the method comprising the steps of:
    a light-shielding film that is formed on a portion of the semitransparent film that corresponds to a portion of the exposure-receiving surface to which a 1st order diffracted light ray of the transmitted light that has passed through the transmitting section is directed,
  the method comprising the steps of:
    successively forming a semitransparent film, a light-shielding film, and a resist film on a transparent substrate;

patterning the resist film so as to provide a pattern of the semitransparent film in a first area after forming the resist film so as to become thinner at the first area than at a second area, as well as removing the light-shielding film and the semitransparent film by using the pattern of the resist film as a mask, and removing only the resist film in the first area completely by utilizing the difference of thicknesses of the resist film in the first area and the second area as well as for removing the light-shielding film by using the resist film in the second area as a mask.

11. The manufacturing method for the photomask as defined in claim 10, wherein the film-thickness difference of the resist film between the first area and the second area is created by setting a dosage of exposure onto the first area to be greater than a dosage of exposure onto the second area.

12. The manufacturing method for the photomask as defined in claim 11, wherein the dosage of exposure is set to zero with respect to the second area, and is also set with respect to the first area so that the remaining film-thickness of the resist film in the first area is approximately one-half of that of the resist film in the second area.

13. The manufacturing method for the photomask as defined in claim 11, wherein the pattern of the resist film in the first area is formed only at a desired position in the first area by applying an additional exposure under the same conditions as the exposure onto the first area after having stopped the exposure onto the whole first area.

14. The manufacturing method for the photomask as defined in claim 10, wherein the portion of the semitransparent film on which the light-shielding film is formed corresponds to a portion of the exposure-receiving surface which receives 1st order diffracted light rays of the transmitted light from differing portions of the transmitting section.

15. The manufacturing method of a photomask as defined in claim 10, wherein the resist film is patterned by Electron Beam exposure.

16. A semiconductor device comprising:

a semiconductor substrate having an exposure-receiving surface; and a pattern that is formed on the semiconductor substrate by using a photomask, the photomask being provided with:

a semitransparent film that has a transmitting section that allows the exposure light to pass without changing the phase of the exposure light, and an inversion transmitting section that is adjacent to the transmitting section for inverting the phase of the exposure light, the semitransparent film being arranged to form a pattern on the transparent substrate by using the inversion transmitting section and the transmitting section; and a light-shielding film that is formed on a portion of the semitransparent film that corresponds to a portion of the exposure-receiving surface to which a 1st order diffracted light ray of the transmitted light that has passed through the transmitting section is directed.

17. A semiconductor device of claim 16, wherein the portion of the semitransparent film on which the light-shielding film is formed corresponds to a portion of the exposure-receiving surface which receives 1st order diffracted light rays of the transmitted light from differing portions of the transmitting section.

18. A manufacturing method for a semiconductor device comprising the steps of:

applying an exposure onto an exposure-receiving surface of a semiconductor substrate through a photomask, the photomask being provided with:

a transparent substrate through which exposure light transmits;

a semitransparent film that has a transmitting section that allows the exposure light to pass without changing the phase of the exposure light, and an inversion transmitting section that is adjacent to the transmitting section for inverting the phase of the exposure light, the semitransparent film being arranged to form a pattern on the transparent substrate by using the inversion transmitting section and the transmitting section; and the method comprising the steps of:

a light-shielding film that is formed on a portion of the semitransparent film that corresponds to a portion of the exposure-receiving surface to which a 1st order diffracted light ray of the transmitted light that has passed through the transmitting section is directed, and forming a pattern onto the semiconductor substrate.

19. The manufacturing method for a semiconductor device as defined in claim 18, wherein the light-shielding film is placed based on only a position at which a sidelobe, which is supposed to be generated on the semiconductor substrate without the light-shielding film due to the interference between the 1st-order diffracted light and the light that has passed through the inversion transmitting section, has the greatest intensity.

20. The manufacturing method for a semiconductor device as defined in claim 19, further comprising the step of:

controlling a mask bias so that the dosage of exposure becomes small at a position on the photomask corresponding to a position at which a sidelobe is generated except for the position having the greatest sidelobe intensity.

21. The manufacturing method for a semiconductor device as recited in claim 18, wherein the portion of the semitransparent film on which the light-shielding film is formed corresponds to a portion of the exposure-receiving surface which receives 1st order diffracted light rays of the transmitted light from differing portions of the transmitting section.

* * * * *